United States Patent [19]

Lauder et al.

[11] Patent Number: 5,294,749
[45] Date of Patent: Mar. 15, 1994

[54] SURFACE MOUNTABLE MOLDED ELECTRONIC COMPONENT

[75] Inventors: James V. Lauder, Ft. Lauderdale; Leng H. Ooi, Sunrise, both of Fla.

[73] Assignee: Motorola, Inc., Schaumburg, Ill.

[21] Appl. No.: 763,785

[22] Filed: Sep. 23, 1991

[51] Int. Cl.⁵ .................. H01L 23/28; H05K 9/00; H01F 27/02
[52] U.S. Cl. .................. 174/52.2; 257/787; 336/96; 174/35 R; 361/773; 361/816
[58] Field of Search .............. 174/52.2, 35 R, 35 MS; 336/96; 29/883, 884; 361/392, 394, 403, 404, 405, 406, 424; 257/659, 787

[56] References Cited

U.S. PATENT DOCUMENTS

| | | | |
|---|---|---|---|
| 3,660,791 | 5/1972 | Davis | 336/96 |
| 4,717,901 | 1/1988 | Autenrieth et al. | 336/83 |
| 4,751,481 | 6/1991 | Guzik et al. | |
| 4,769,900 | 9/1988 | Morinaga et al. | 29/606 |

Primary Examiner—Leo P. Picard
Assistant Examiner—B. Lee Ledynh
Attorney, Agent, or Firm—Pedro P. Hernandez

[57] ABSTRACT

A surface mountable molded electronic component (100) is made from formed wire having a main portion (202) and end portions (102 and 104) connected to the main portion (202). The electronic component (100) includes a first and second recess areas (108 and 110) in molded section (114) for allowing the end portions (102 and 104) to lie inside and provide for the component (100) to be surfaced mounted onto a printed circuit board.

15 Claims, 3 Drawing Sheets

SURFACE MOUNTABLE MOLDED ELECTRONIC COMPONENT

TECHNICAL FIELD

This invention relates generally to molded electronic components and more particularly to surface mountable molded electronic components.

BACKGROUND

Known molded electronic component technology includes such molded electronic components as molded resonators and coils. These known molded components have a major limitation in that they are difficult to mount on circuit boards. Typically, these molded components fall into two main categories. First, those that have short leads extending from the main molded component body which require hand placement followed by separate solder reflowing due to the components difficult placement characteristics. Second, those molded components which have the tendency of creating microphonics, due to the moving or vibrating of the component during use, caused by the long leads of the component. Modern manufacturing techniques require that the majority, if not all, of the electronic components found in an assembly be capable of being surface mounted in order to increase manufacturing cycle times and to also minimize the problem of microphonics. By being able to have all components surface mountable, solder clad processes can then be utilized which shorten manufacturing cycle times and at the same time reduce microphonics. A need thus exists for a molded electronic component which can overcome the major mounting limitations found in prior art molded components.

SUMMARY OF THE INVENTION

The surface mount molded electronic component includes a formed element having a main portion and end portions providing electrical connection to the main portion. The electronic component further includes a dielectric portion molded about the main portion having an outer surface, the dielectric portion including first and second recess areas located on the outer surface for providing channels for the end portions to lie in and form surface mount contacts.

In one aspect of the invention, the surface mount electronic component is a resonator.

In another aspect of the invention, the surface mount molded electronic component is part of a communication device.

DETAILED DESCRIPTION OF THE PREFERRED EMBODIMENT

Figure 1:
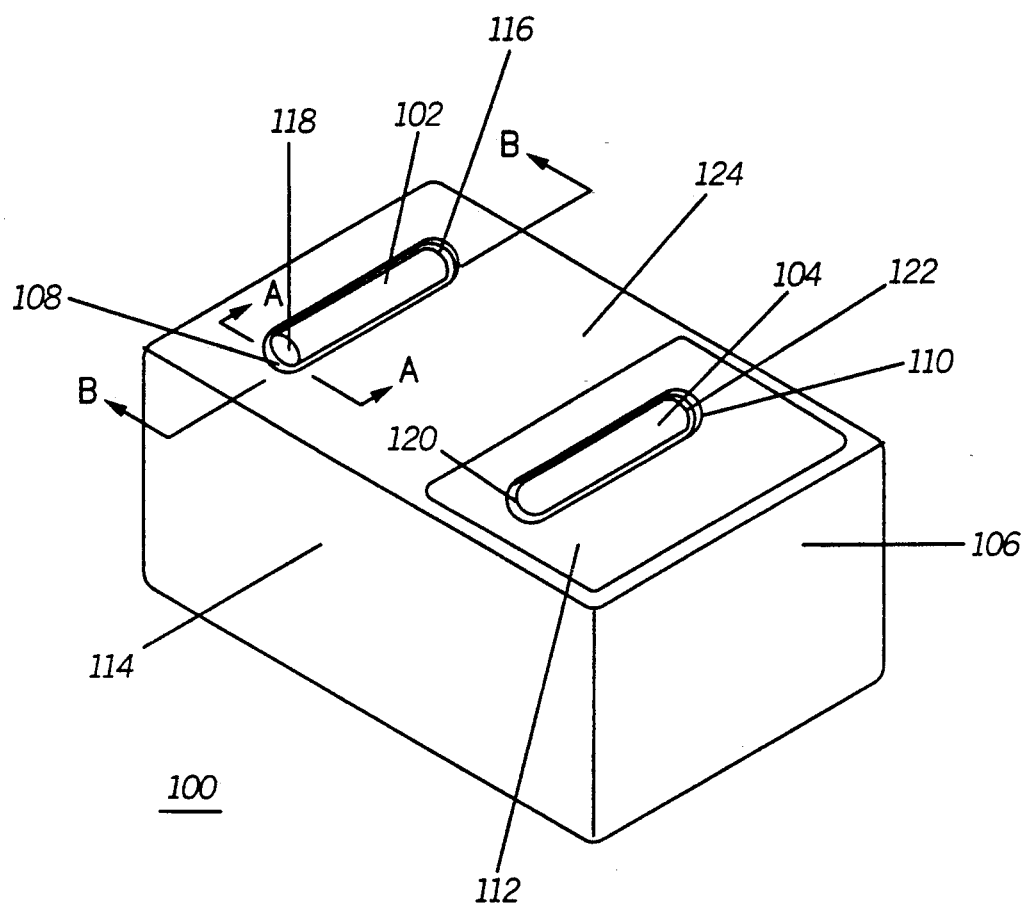
FIG. 1 is a perspective view of a molded helical coil in accordance with the present invention.

Referring now by characters of reference to the drawings and first to FIG. 1, there is shown a surface mountable molded helical coil 100 in accordance with the present invention. Coil 100 can be molded from any of a number of suitable materials such as polyetherimide having a 10% fiberglass content such as sold under the tradename ULTEM 2100 by General Electric company. Coil 100 can be molded using one of a number of conventional molding techniques such as insert molding or preferably, double shot molding. A basic overview of the double shot molding of a wire formed resonator may be found in U.S. Pat. No. 4,751,481 by Guzik et al. entitled "Molded Resonator" and is incorporated by reference as if fully set forth herein.

Preferably, after coil 100 is molded, its outer surface 106 is selectively metallized by first sputtering chrome or another comparable material such as titanium, tungsten or aluminium which provides the "glue layer", allowing for the metallization of the molding material. This is then followed by the sputtering of copper, or another comparable metallization material, and then finally by the plating of the outer surface with gold. All of the above steps are performed using conventional manufacturing techniques known in the art. Preferably, all of the coil's main molded portion 114 is metallized except for surface area 112 in order to provide coil 100 with a ground plane which shields coil 100 whenever the metallized surface is grounded. In the preferred embodiment, surface area 112 is not metallized in order to allow for end portion or contact 104 from making contact with the outer metallized surface 106. Those skilled in the art will realize that both of the end portions (or end terminals) 102 and 104 can be made to be isolated from the metallized outer surface 106 (e.g., in the case one wants to use coil 100 in a series or in-line configuration, in this case one can provide for a solder bump to make contact in a portion of the metallized outer surface 106 in order to provide ground potential to the surface).

Coil 100 further includes in its surface mount side 124 first and second recess locations 108 and 110 respectively, which provide channels for end portions 102 and 104 to rest in once they are bent into their appropriate positions. This provides coil 100 with surface mountable terminals or contacts which can be laid on top of a printed circuit board or ceramic substrate. Recessing the bent wire end portions 102 and 104 into cavities 108 and 110 respectively, allows for coil 100 to be mounted on solder clad circuit boards and thereby does away with dispensed solder or solder reflowing techniques, which are required with known molded components.

Coil 100 is preferably formed from a wire having a circular cross-section which is double shot molded leaving only end portions 102 and 104 without being molded. Once the main portion of the coil is molded, the two end terminals 102 and 104 are bent into their corresponding recesses 108 and 110 at approximately 90 degrees angles. Preferably, in order to properly balance coil 100, the end portions 102 and 104 protrude from the molded section from different sides 116 and 120. As shown, the end portion 118 and 122 of each of the end terminals 102 and 104 point in opposite directions in the preferred embodiment. Although the coil 100 is a preferably circular cross-section wire, a similar electrical conductive malleable material, which can be formed into shapes such as coils and resonators, can be used.

Figure 2:
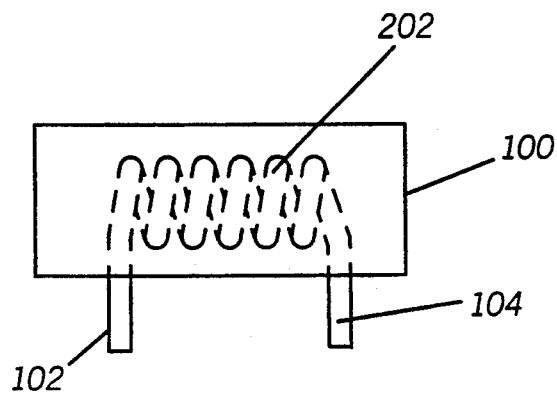
FIG. 2 is a side view of the helical coil showing the coil inside of the mold and showing the coil's end terminals prior to being bent in accordance with the present invention.

In FIG. 2, a side view of the coil structure of FIG. 1, showing the main portion 202 of coil 100, with the end portions 102 and 104 prior to them being bent into their appropriate recesses. End portions 102 and 104 are electrically coupled to main portion 202 at opposed ends of main portion 202. Main portion 202 is shown to be a helical coil having the two end portions 102 and 104. End portions 102 and 104 which are electrically connected to the main portion 202 are sheared to proper lengths prior to being bent in order for the bent end portions 102 and 104 to fit perfectly inside of recesses 108 and 110 (shown in FIG. 1).

Although a helical coil 202 has been shown as the preferred embodiment, those skilled in the art will realize that the same design techniques shown in the present invention can be utilized in resonators such as transmission lines and strip lines (e.g. such as the transmission line (resonator) taught by Guzik, et al. U.S. Pat. No. 4,751,481 referred to previously), inductors, and other electronic components which can be formed from wire or other malleable materials. Any number of end portions such as end terminals 102 and 104 can be included as part of the molded component, the number of end portions will depend on the type of electronic component being molded. As well, the number of main portions 202 can also vary depending on the complexity of the electronic component involved (e.g., a multi-element resonator).

Figure 3:
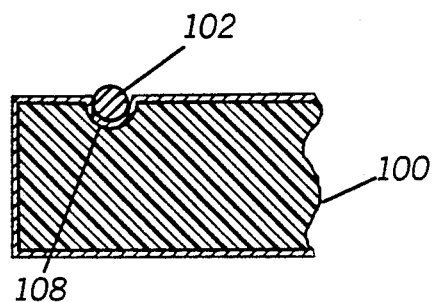
FIG. 3 is a partial cross-sectional view of FIG. 1 taken along line A—A.

In FIG. 3, a partial cross-sectional view of FIG. 1 taken along line A—A is shown. Here we can see how end portion (terminal) 102 fits inside of recess 108 allowing a portion of the wire insert which makes up end portion 102 to protrude above surface mount side 124. This allows the end portion 102 to be placed on a printed circuit board and become surface mounted using conventional solder clad processes. The bent side of end portion 102 is not required to protrude above surface mount side 124, although the soldering of end portion 102 becomes somewhat more difficult if it does not protrude above side 124. Also, it is preferable to keep end portion (now a surface mount contact) 102 flush against cavity or recess 108 thereby minimizing any microphonics associated with coil 100 (by keeping end portion 102 flush minimizes any vibration of coil 100 once it is soldered into lace).

Figure 4:
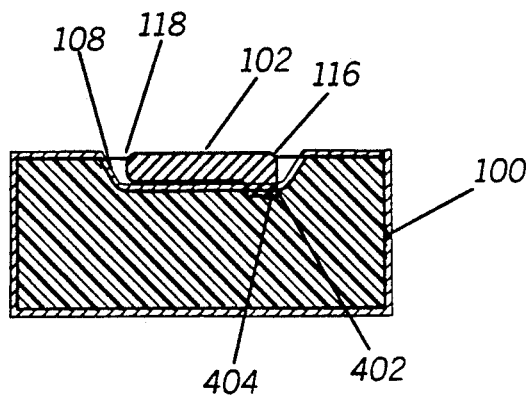
FIG. 4 is a partial cross-sectional view of FIG. 1 taken along line B—B.

In FIG. 4, a partial cross-sectional view of FIG. 1 taken along line B—B is shown. End portion 102 is shown lying inside of recess (or cavity) 108. The point were the main portion 202 (not shown) of the coil element protrudes through the molded section 402 is shown at one end of recess 108, while the end section 118 of end portion (terminal) 102 is shown at the other end of recess 108. The point where the main portion 202 of the helical coil begins is shown by cut off line 404. As can be seen, the length of surface of end portion 102 from the side 116 where the end portions is bent to the end section 118 allows for enough bonding area to make molded component 100 surface mountable.

Figure 5:
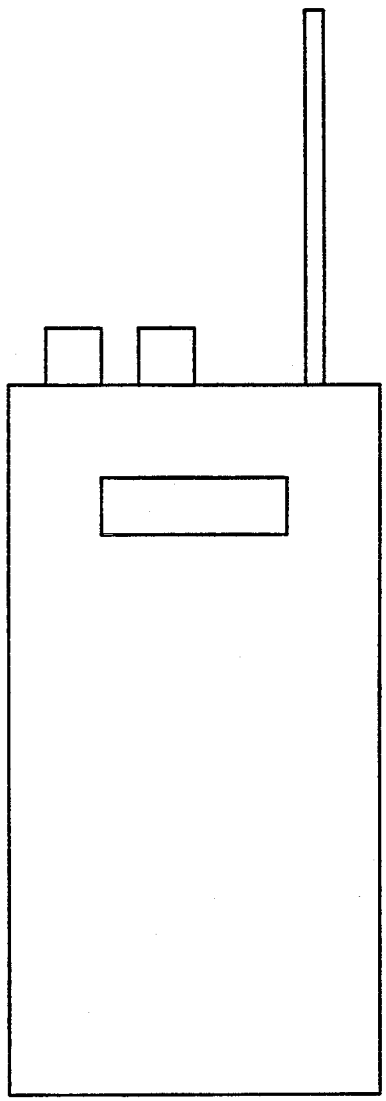
FIG. 5 is a front view of a communication device utilizing the present invention.

In FIG. 5, a front view of a communication device such as a two way radio 500 is shown. Radio 500 includes conventional transmitter and receiver circuits for transmitting and receiving information. Preferably, radio 500 includes at least one or more of the surface mountable molded electronic components 100 as described above in order to gain the benefits of the present invention.

In summary, the invention provides for a simple means of converting any molded electronic component which is manufactured from wire to become a surface mountable component, providing all of the benefits and cost savings attributed to surface mount component technology. A decrease in manufacturing cycle time in both the manufacturing of coil 100 itself and in the mounting of the coil 100 are achieved with the present design. Also, the invention overcomes the problems associated with the prior art in requiring the dispensing or printing of solder in order to solder the component. A typical prior art mounting approach for molded components is to leave an island or depression along the mounting surface of the component, where the end portions are found sheared even with the mounting surface, and then solder resist is placed in the depression for later solder reflowing. This approach unfortunately is slow and cumbersome as compared to the present invention which allows for the mounting onto solder clad circuit boards.

Some of the prior art designs also required the hand placement of each individual component which the present invention overcomes. The present invention can also be placed on conventional component reels in order to placed automatically by placement machines, thereby improving the time required to place the component. By minimizing the length of the end portions (surface mount contacts) 102 and 104 and keeping them close to the main body 114 of coil 100 itself, any movement in coil 100 which can cause microphonics is reduced to a minimum.

What is claimed is:

1. A surface mountable molded electronic component, comprising:
  a formed element having a main portion and first and second end portions each having an outer surface, the first and second end portions are electrically connected to the main portion; and
  a dielectric portion molded about the main portion and having an outer surface which includes a surface mount surface, the dielectric portion including first and second recess areas located on the surface mount surface, the first and second end portions protrude through the surface mount surface and are bent one each into the first and second recess areas such that the outer surfaces of the first and second end portions form surface mount contacts.

2. The surface mountable molded component of claim 1, wherein the formed element is an reactive element.

3. The surface mountable molded component of claim 1, wherein the formed element is a helical coil.

4. The surface mountable molded component of claim 1, wherein the formed element is formed from wire having a substantially circular cross-section.

5. The surface mountable molded component of claim 1, further including a conductive ground plane carried by the dielectric portion's outer surface which electrically shields the main portion of the formed element.

6. The surface mountable molded component of claim 5, wherein the formed element is a resonator.

7. A surface mountable molded electronic component, comprising:
  a formed element having a main portion and first and second end portions each having an outer surface, the first and second end portions are electrically connected to the main portion; and a dielectric portion molded about the main portion, including a first molding of dielectric material in which the main portion is precisely positioned, and a second molding of dielectric material providing an outer surface having a surface mount side, the second molding includes first and second recess areas located on the surface mount side, the first and second end portions protrude through the surface mount side and are bent one each into the first and second recess areas such that the outer surfaces of the first and second end portions form surface mount contacts.

8. The surface mountable molded electronic component as defined in claim 7, further comprising:
a conductive ground plane carried by the dielectric portion's outer surface for electrically shielding the main portion of the formed element.

9. The surface mountable molded electronic component as defined in claim 7, in which the formed element is formed from wire having a circular cross-section.

10. The surface mountable molded electronic component as defined in claim 7, in which the formed element is a helical coil.

11. The surface mountable molded electronic component as defined in claim 8, in which the formed element is a resonator.

12. The surface mountable molded electronic component as defined in claim 8, in which one of the end portions is electrically connected to the conductive ground plane.

13. A communication device, comprising:
a receiver;
the receiver including:
a formed element having a main portion and first and second end portions each having an outer surface, the first and second end portions are electrically connected to the main portion; and
a dielectric portion molded about the main portion and having an outer surface which includes a surface mount surface, the dielectric portion including first and second recess areas located on the surface mount surface, the first and second end portions protrude through the surface mount surface and are bent one each into the first and second recess areas such that the outer surfaces of the first and second end portions form surface mount contacts.

14. The communication device of claim 13, further including a conductive ground plane carried by the dielectric portion's outer surface which electrically shields the main portion of the formed element.

15. The communication device of claim 14, wherein the formed element is a resonator.

* * * * *